United States Patent
Lin et al.

(10) Patent No.: US 10,727,068 B2
(45) Date of Patent: Jul. 28, 2020

(54) METHOD FOR MANUFACTURING SEMICONDUCTOR STRUCTURE WITH MASK STRUCTURE

(71) Applicant: Taiwan Semiconductor Manufacturing Co., Ltd., Hsinchu (TW)

(72) Inventors: Hsin-Ying Lin, Tainan (TW); Mei-Yun Wang, Chu-Pei (TW); Hsien-Cheng Wang, Hsinchu (TW); Fu-Kai Yang, Hsinchu (TW); Shih-Wen Liu, Taoyuan County (TW); Hsiao-Chiu Hsu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/596,518

(22) Filed: Oct. 8, 2019

(65) Prior Publication Data

US 2020/0051821 A1    Feb. 13, 2020

Related U.S. Application Data

(60) Continuation of application No. 15/240,680, filed on Aug. 18, 2016, now Pat. No. 10,468,257, which is a (Continued)

(51) Int. Cl.
*H01L 21/28* (2006.01)
*H01L 29/40* (2006.01)
(Continued)

(52) U.S. Cl.
CPC .... *H01L 21/28123* (2013.01); *H01L 21/0334* (2013.01); *H01L 21/76805* (2013.01);
(Continued)

(58) Field of Classification Search
None
See application file for complete search history.

(56) References Cited

U.S. PATENT DOCUMENTS 7,195,969 B2   3/2007   Chan et al.
7,807,567 B2   10/2010  Kawano et al.
(Continued)

OTHER PUBLICATIONS

C. G. Willson and M. D. Stewart, "Encyclopedia of Materials: Science and Technology", ISBN: 0-08-0431526, pp. 6973-6978 (Year: 2001).*

(Continued)

*Primary Examiner* — Vincent Wall
(74) *Attorney, Agent, or Firm* — Birch, Stewart, Kolasch & Birch, LLP

(57) ABSTRACT

Semiconductor structures and methods for forming the same are provided. The method includes forming a dummy gate structure and forming a spacer on a lower portion of a sidewall of the dummy gate structure and exposing an upper portion of the sidewall of the dummy gate structure. The method further includes forming a dielectric layer covering the upper portion of the sidewall of the dummy gate structure exposed by the spacer and removing the dummy gate structure to form a tube-shaped trench. The method further includes removing a portion of the dielectric layer to form a cone-shaped trench and forming a gate structure in a bottom portion of the tube-shaped trench. The method further includes forming a hard mask structure in the cone-shaped trench and an upper portion of the tube-shaped trench, and an interface between the hard mask structure and the dielectric layer overlaps the spacer.

20 Claims, 10 Drawing Sheets

Related U.S. Application Data division of application No. 14/073,408, filed on Nov. 6, 2013, now Pat. No. 9,425,048.

(51) Int. Cl.
- *H01L 21/033* (2006.01)
- *H01L 29/423* (2006.01)
- *H01L 29/66* (2006.01)
- *H01L 29/49* (2006.01)
- *H01L 21/768* (2006.01)

(52) U.S. Cl.
CPC ...... *H01L 21/76897* (2013.01); *H01L 29/402* (2013.01); *H01L 29/42376* (2013.01); *H01L 29/4983* (2013.01); *H01L 29/6653* (2013.01); *H01L 29/6656* (2013.01); *H01L 29/6659* (2013.01); *H01L 29/66545* (2013.01)

(56) References Cited

U.S. PATENT DOCUMENTS

| | | |
|---|---|---|
| 2009/0189201 A1 | 7/2009 | Chang et al. |
| 2010/0044783 A1 | 2/2010 | Chuang et al. |
| 2011/0079854 A1 | 4/2011 | Lin |
| 2011/0151655 A1* | 6/2011 | Chan ................ H01L 21/28079 438/589 |
| 2012/0086048 A1 | 4/2012 | Park et al. |
| 2012/0119307 A1* | 5/2012 | Li ..................... H01L 21/76816 257/410 |
| 2012/0139062 A1* | 6/2012 | Yuan ................ H01L 21/76897 257/411 |
| 2013/0187203 A1* | 7/2013 | Xie .................... H01L 21/28088 257/288 |
| 2014/0231885 A1 | 8/2014 | Xie et al. |

OTHER PUBLICATIONS

T.P. Ma, "High-k Gate Dielectrics for Future CMOS Technology", 4th COE Workshop Proceedings, Sep. 16, 2005, pp. 1-20.

\* cited by examiner

METHOD FOR MANUFACTURING SEMICONDUCTOR STRUCTURE WITH MASK STRUCTURE

PRIORITY CLAIM AND CROSS-REFERENCE

This application is a continuation application of U.S. patent application Ser. No. 15/240,680, filed on Aug. 18, 2016, the entire of which is incorporated by reference herein. The U.S. patent application Ser. No. 15/240,680 is a Divisional application of U.S. patent application Ser. No. 14/073,408, filed on Nov. 6, 2013, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

As technology nodes shrink, in some integrated circuit (IC) designs, there has been a desire to replace the typically polysilicon gate with a metal gate to improve device performance with the decreased feature sizes. One process of forming the metal gate is termed the "gate last" process. In a "gate last" process, the final metal gate is fabricated last which allows for a reduced number of subsequent processes.

However, although existing "gate last" processes have been generally adequate for their intended purposes, as device scaling-down continues, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
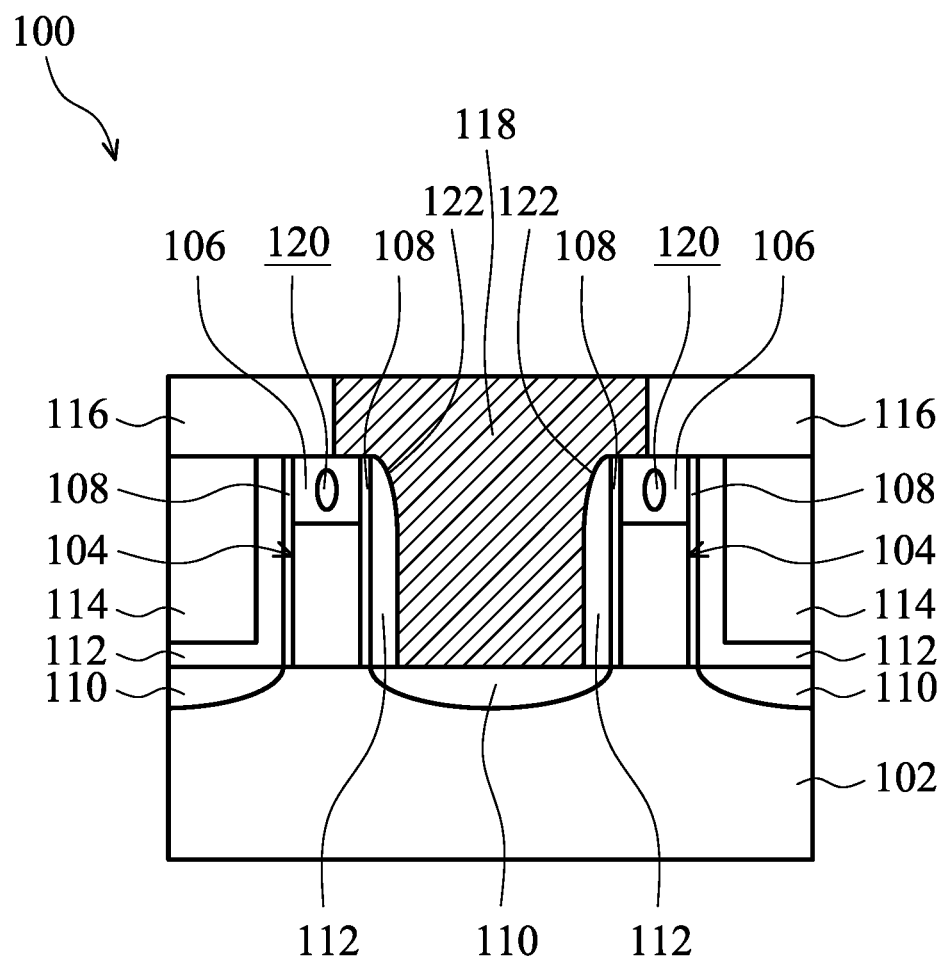
FIG. 1 illustrates a cross-section of representation of a semiconductor device structure in accordance with some embodiments.

Mechanisms for a semiconductor device structure are provided in accordance with some embodiments of the disclosure. FIG. 1 illustrates a cross-section representation of a semiconductor device structure 100. Referring to FIG. 1, semiconductor device structure 100 includes a substrate 102, a metal gate structure 104, a hard mask structure 106, a sealing layer 108, source and drain regions 110, a contact etch stop layer (CESL) 112, an inter-layer dielectric (ILD) layer 114, a dielectric layer 116, and a contact 118.

Hard mask structure 106 needs to be thick enough to prevent contact 118 from contacting metal gate structure 104. However, when forming the thick and rectangular hard mask structure 106, voids 120 tends to be formed in hard mask structure 106. Therefore, during the subsequent processes, the formation of contact 118 on voids 120 should be avoided or the conductive material of contact 118 may fill into voids 120. If the conductive material of contact 118 fills into voids 120, shortage between contact 118 and metal gate structure 104 happens. In addition, the allowable landing area of contact 118 on hard mask structure 106 tends to be small while narrowing down line width. As shown in FIG. 1, the resulting contact 118 has curving sidewalls 122, and curving sidewalls 122 may be too close to metal gate structure 104 and may also result in shortage of the structure.

Figure 2A:
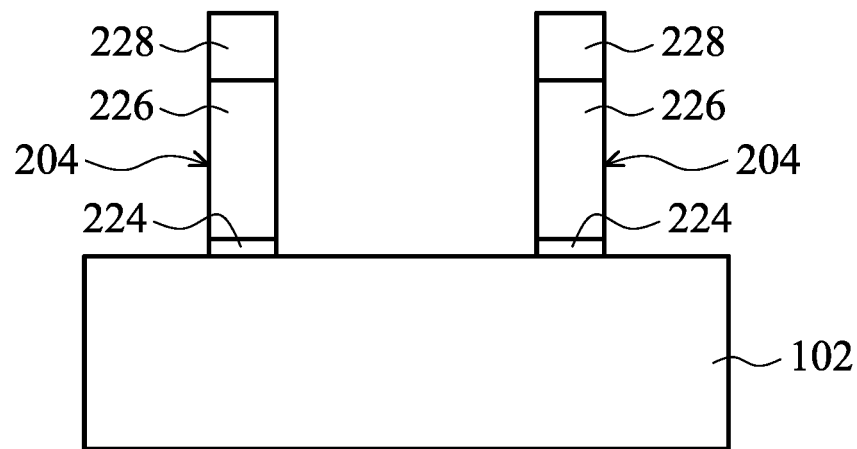
FIG. 2A to 2R illustrate cross-section representations of various stages of forming a semiconductor device structure in accordance with some embodiments.
Figure 2B:
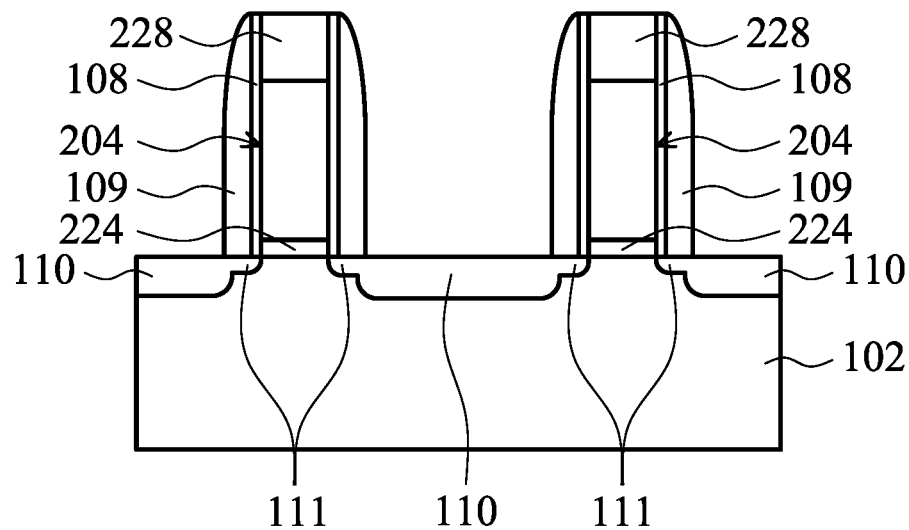
Figure 2C:
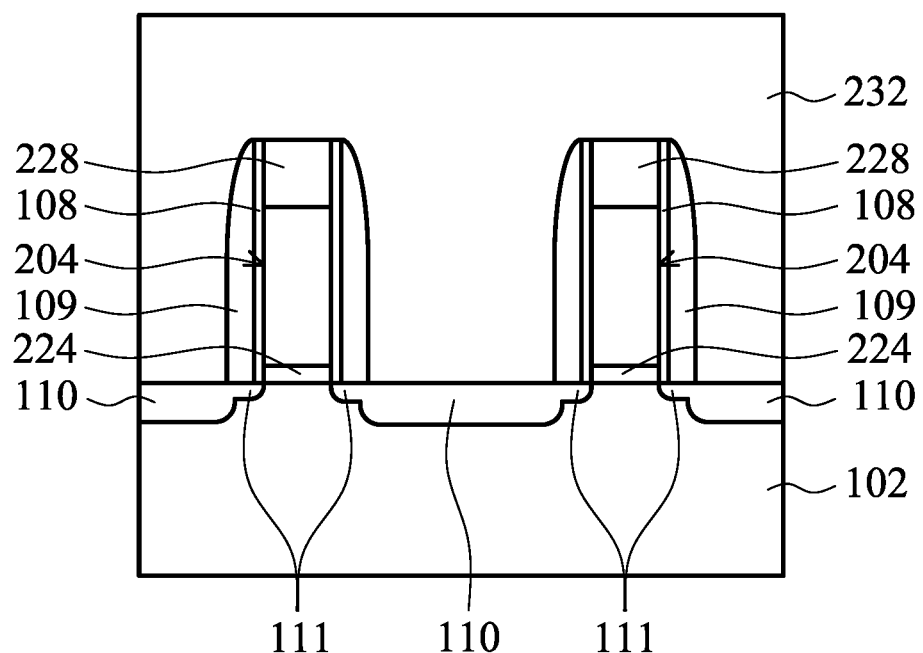
Figure 2D:
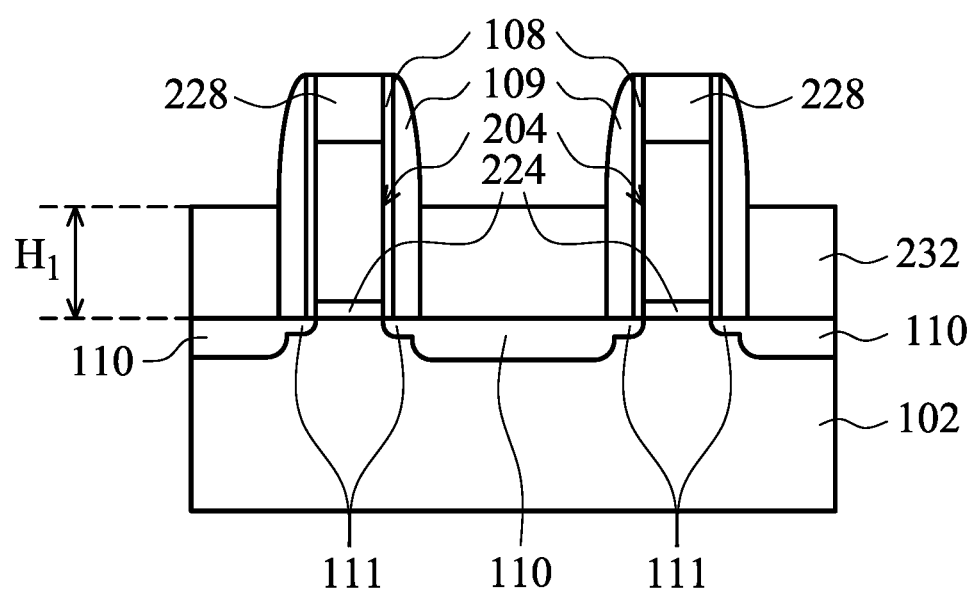
Figure 2E:
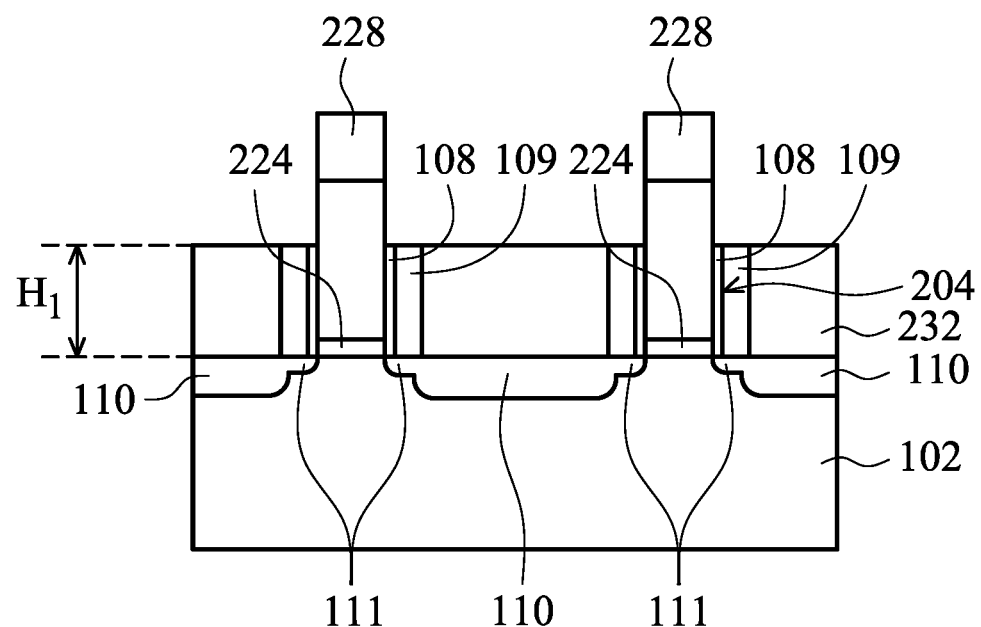
Figure 2F:
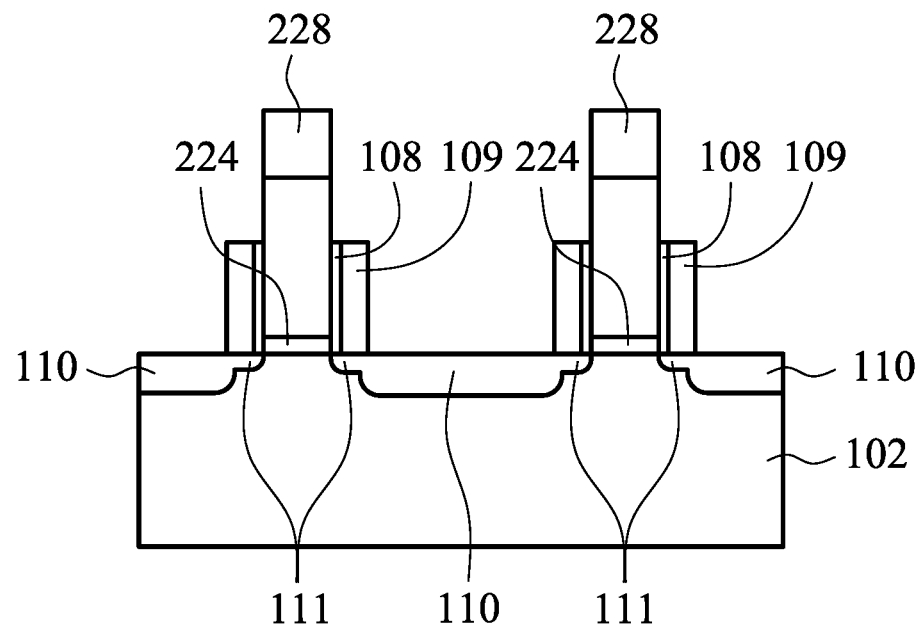
Figure 2G:
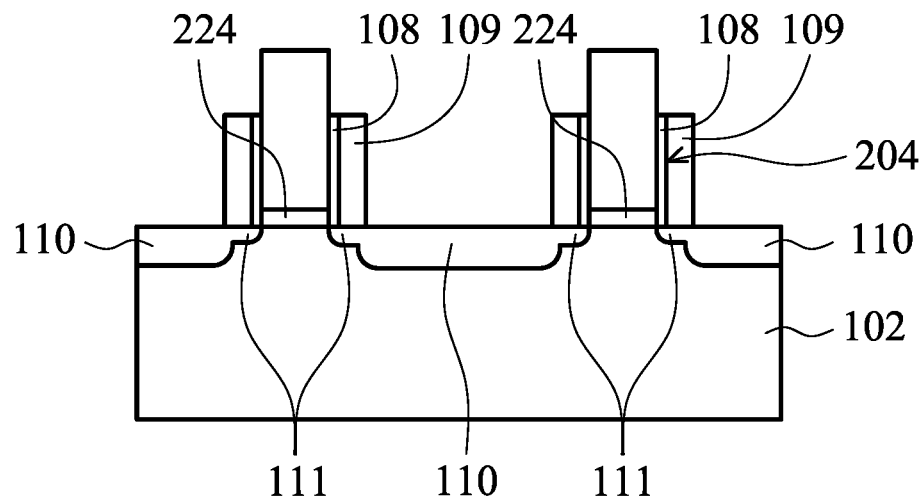
Figure 2H:
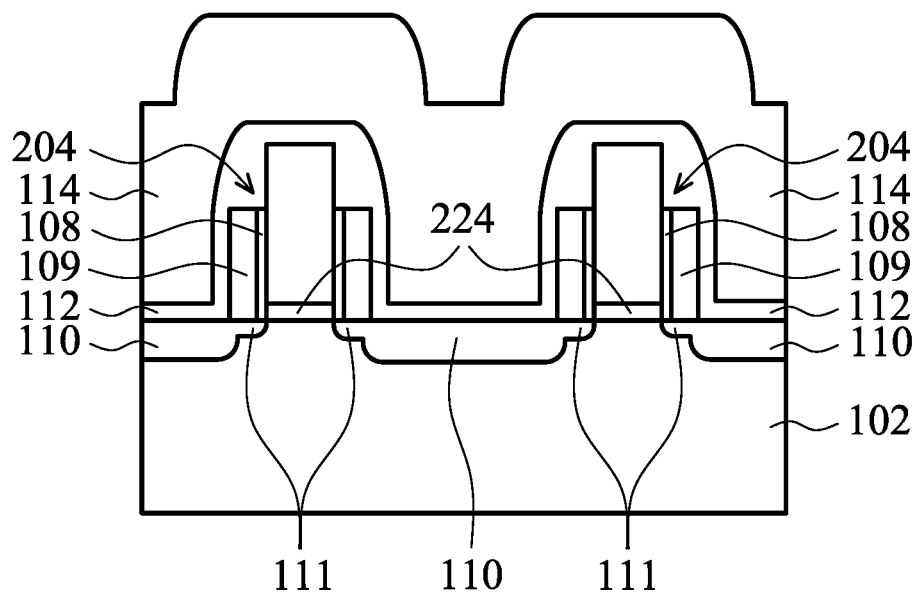
Figure 2I:
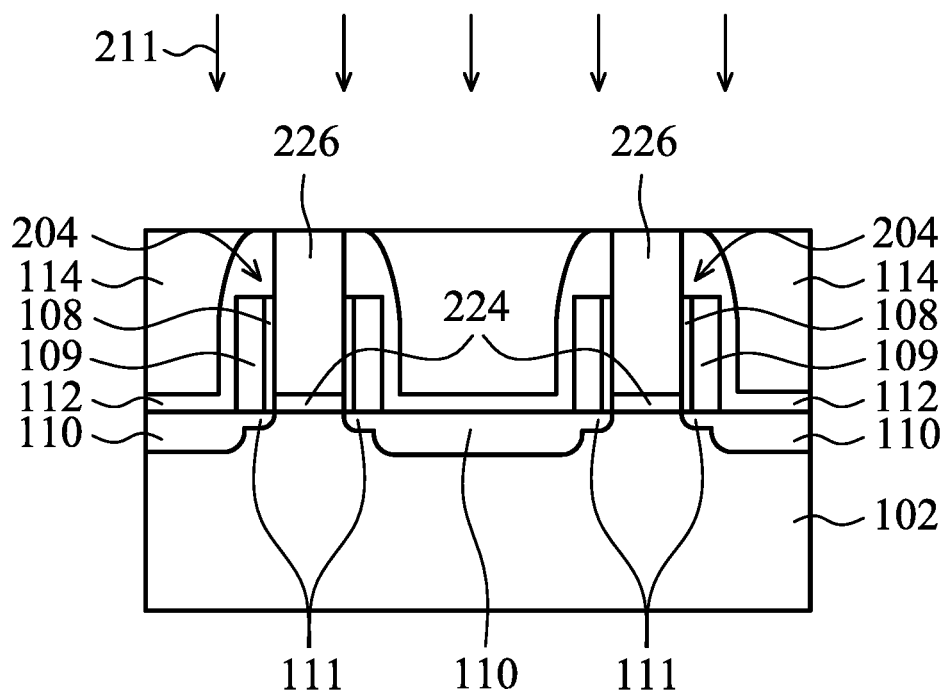
Figure 2J:
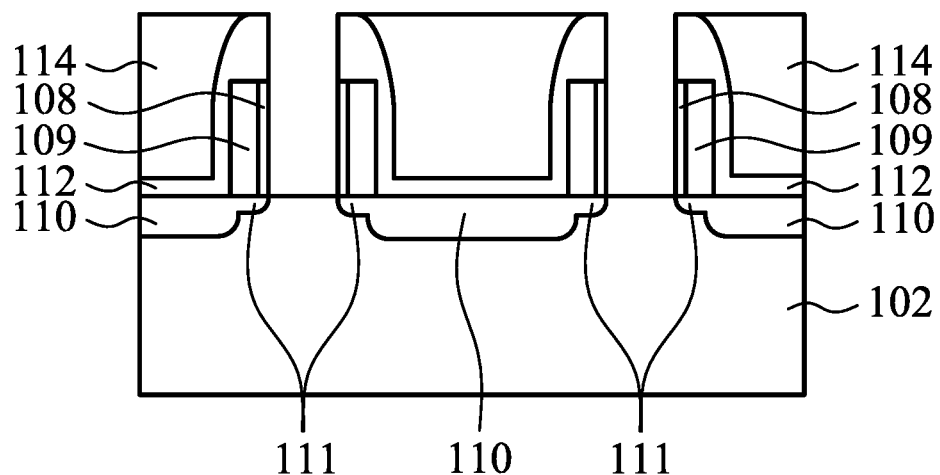
Figure 2K:
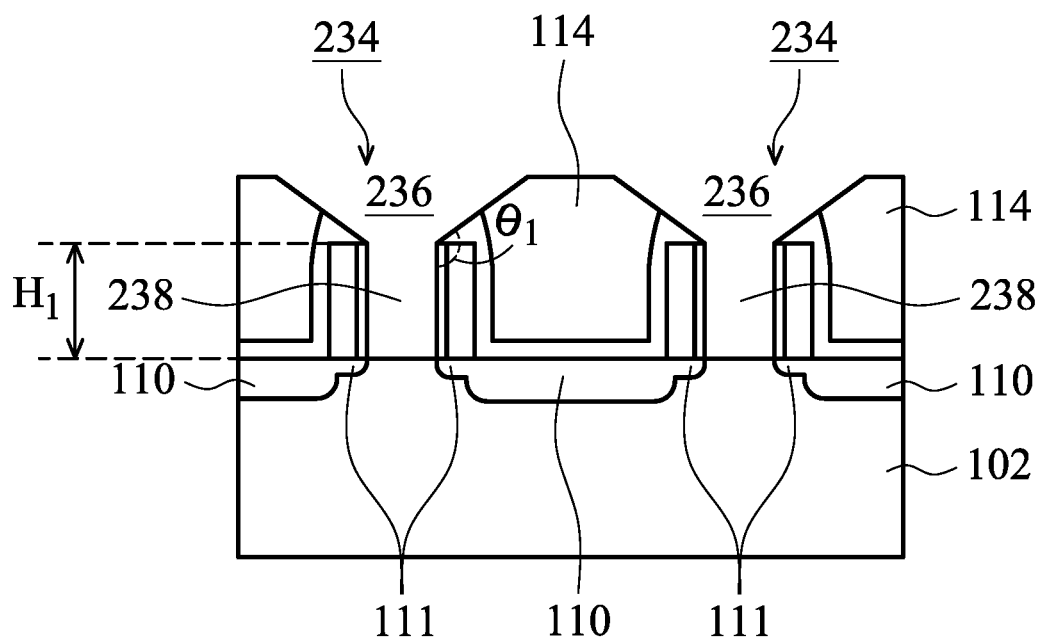
Figure 2L:
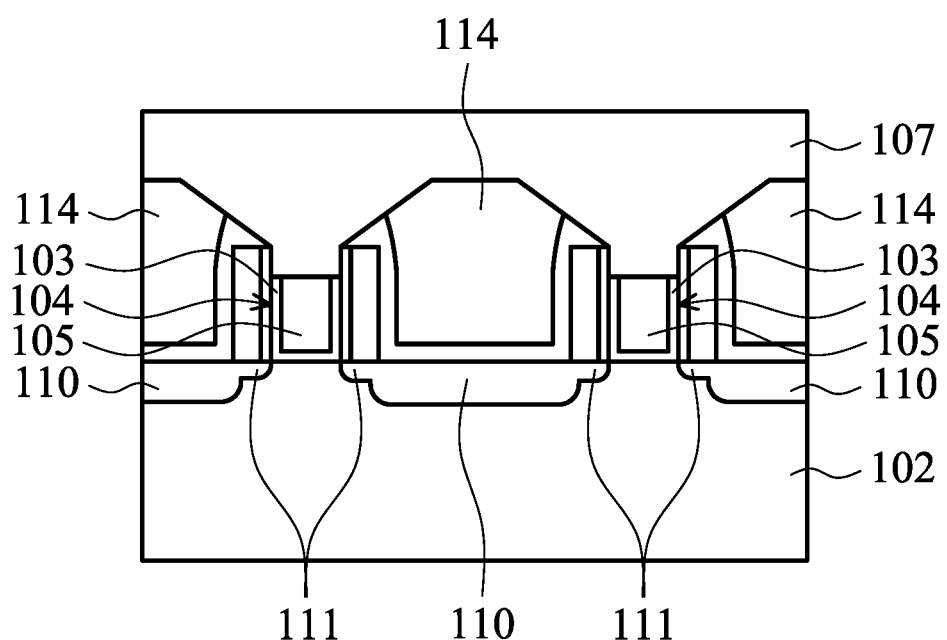
Figure 2M:
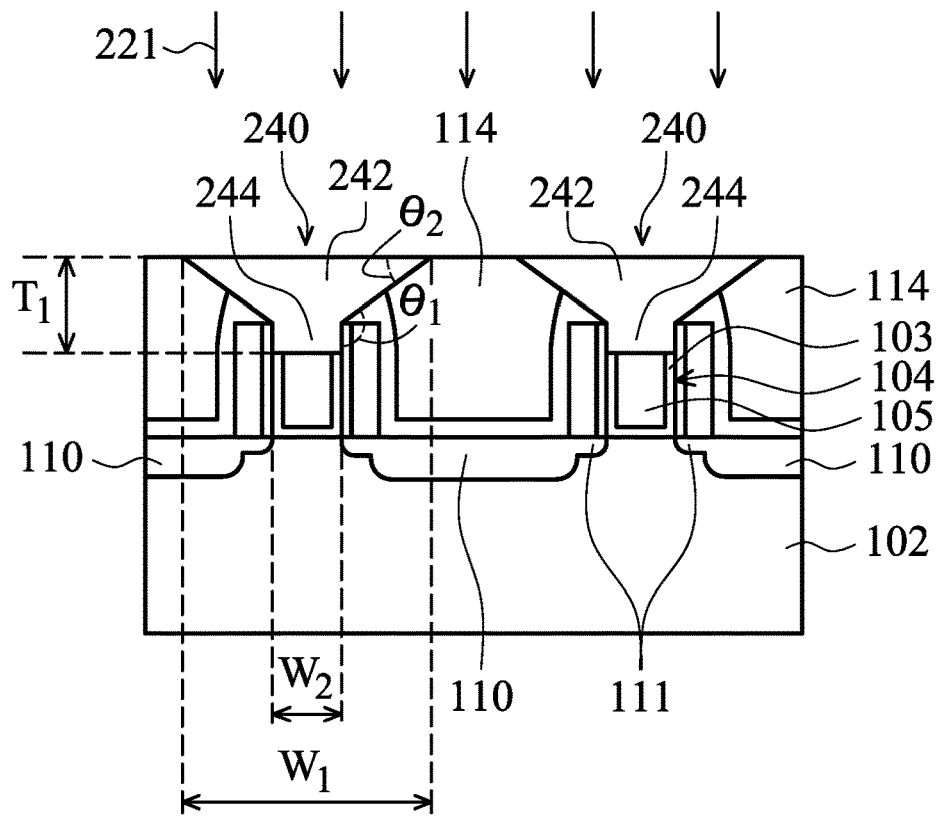
Figure 2N:
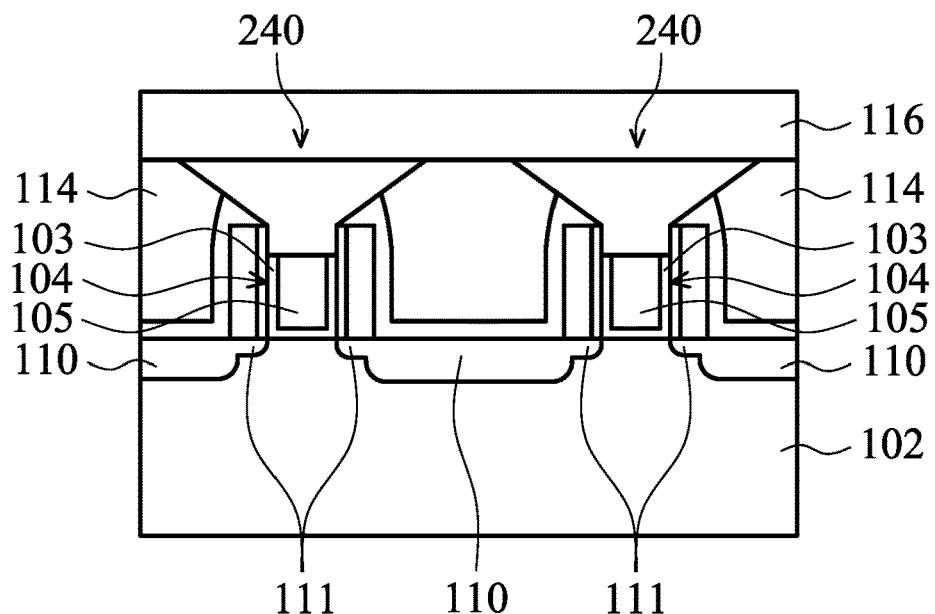
Figure 2O:
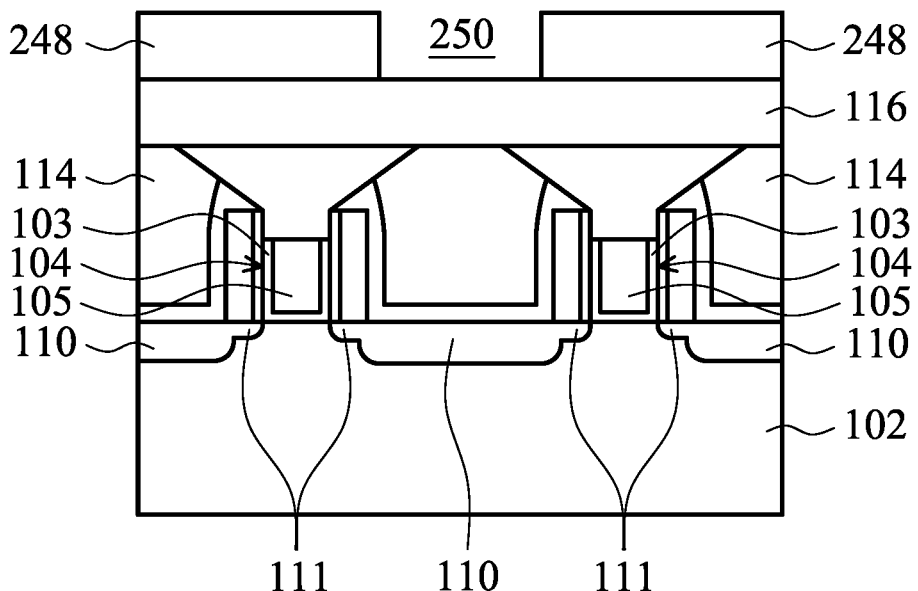
Figure 2P:
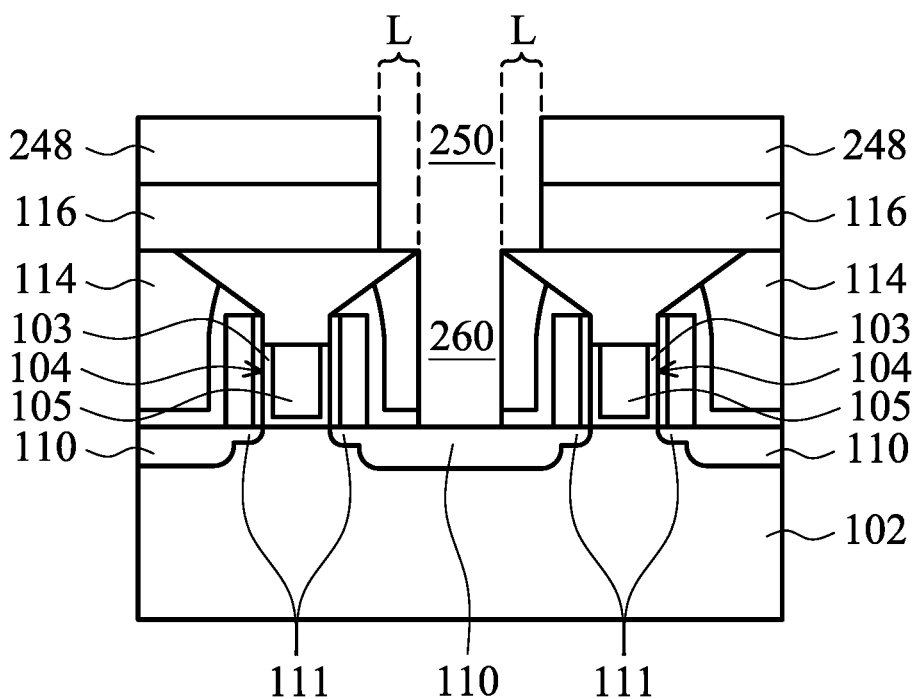
Figure 2Q:
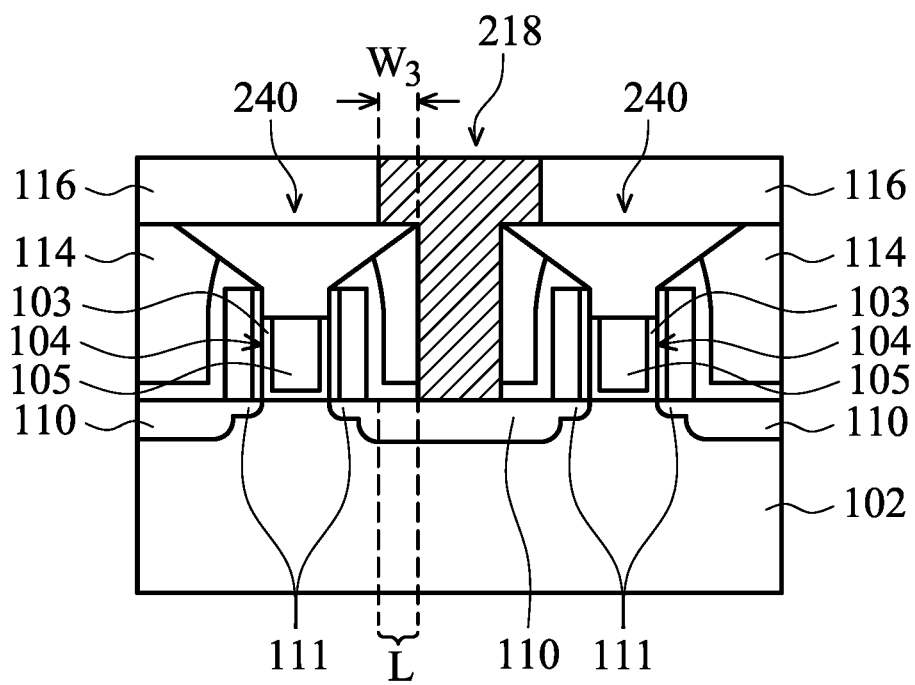
Figure 2R:
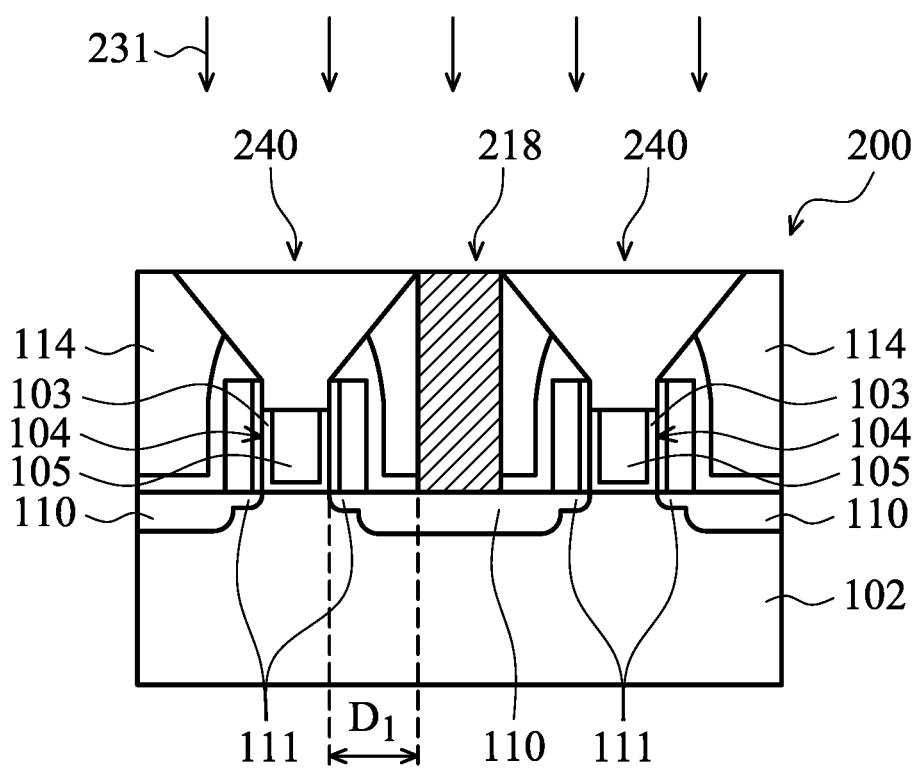

FIGS. 2A to 2R illustrate cross-section representations of various stages of forming a semiconductor device structure 200 in accordance with some embodiments. As shown in FIG. 2A, substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, substrate 102 includes structures such as doped regions, isolation features, ILD layers, and/or conductive features. In addition, substrate 102 may further include one or more material layers to be patterned. For example, the material layers to be patterned include a silicon layer, a dielectric layer, and/or a doped poly-silicon layer.

As shown in FIG. 2A, a dummy gate structure 204 is formed over substrate 102 in accordance with some embodiments. In some embodiments, dummy gate structure 204 includes dummy gate dielectric layer 224 and dummy gate electrode 226. In some embodiments, dummy gate dielectric layer 224 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. In some embodiments, dummy gate electrode 226 is made of polysilicon.

Dummy gate structure 204 may be formed by a procedure including deposition, photolithography patterning and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

In some embodiments, a hard mask layer 228 is further formed over dummy gate electrode 226. In some embodiments, hard mask layer 228 is made of silicon oxide, silicon nitride, silicon oxynitride, or silicon carbide. Hard mask layer 228 may be formed by a CVD process.

After dummy gate structure 204 is formed, sealing layer 108 is formed on the sidewalls of dummy gate structure 204, as shown in FIG. 2B in accordance with some embodiments. Sealing layer 108 may protect dummy gate structure 204 from damage or loss during subsequent processing and may also prevent oxidation during subsequent processing. In some embodiments, sealing layer 108 is made of silicon nitride, silicon oxide, silicon oxynitride, silicon carbide, or other applicable dielectric materials. Sealing layer 108 may include a single layer or multiple layers.

Spacers 109 are further formed on sealing layer 108 in accordance with some embodiments. In some embodiments, spacers 109 are made of silicon nitride, silicon oxide, silicon carbide, silicon oxynitride, or other applicable materials. Spacers 109 may be formed by deposition and etching processes.

In addition, various doped regions may also be formed in substrate 102. In some embodiments, lightly doped source/drain (LDD) regions 111 and source/drain (S/D) regions 110 are formed in substrate 102, as shown in FIG. 2B. LDD regions 111 and S/D regions 110 may be formed by one or more ion implantation processes, photolithography, diffusion, and/or other applicable processes. The doping species may depend on the type of device being fabricated. In some embodiments, LDD regions 111 and S/D regions 110 are doped with p-type dopants, such as boron or $BF_2$, and/or n-type dopants, such as phosphorus or arsenic.

Next, a photoresist layer 232 is formed over substrate 102 to cover dummy gate structure 204, as shown in FIG. 2C in accordance with some embodiments. Photoresist layer 232 may be a positive or negative photoresist layer. In some embodiments, photoresist layer 232 is formed by spin-on coating. Additionally, a bake process may be applied to photoresist layer 232 in accordance with some embodiments. In some embodiments, the bake process is a soft baking process. The bake process may be used to remove the solvent in photoresist layer 232.

Afterwards, an etch back process is performed on photoresist layer 232, as shown in FIG. 2D in accordance with some embodiments. By the etch back process, photoresist layer 232 is etched to expose a top portion of dummy gate structure 204. In some embodiments, the etch back process is a wet etching process or a reactive ion etching (RIE) process. In some embodiments, photoresist layer 232 is etched using an etchant containing such as oxygen or argon plasma. It should be noted that various solution may be used during the etching process described herein or afterwards depending on various applications.

As shown in FIG. 2D, hard mask layer 228 has good etch selectively toward photoresist layer 232 during the etch back process. Therefore, hard mask layer 228 is not removed by the etch back process. In some embodiments, the etched photoresist layer 232 has a thickness $H_1$ in a range from about 10 nm to about 100 nm.

After the etch back process is performed, portions of sealing layer 108 and spacers 109 not covered by (e.g. exposed by) photoresist layer 232 are removed, as shown in FIG. 2E in accordance with some embodiments. Remaining portions of sealing layer 108 and spacers 109 have a height substantially equal to height $H_1$. In some embodiments, the exposed portions of sealing layer 108 and spacers 109 are removed by a wet etching process.

Next, photoresist layer 232 is removed, as shown in FIG. 2F in accordance with some embodiments. In some embodiments, photoresist layer 232 is removed by a wet etching process. After photoresist layer 232 is removed, hard mask layer 228 is also removed, as shown in FIG. 2G in accordance with some embodiments. Hard mask layer 228 may be removed by any applicable techniques, such as a wet etching process using an applicable acidic solution, such as $CHF_3$ or $CH_2F_2$. As shown in FIG. 2G, remaining portions of sealing layer 108 and spacers 109 cover a bottom portion of dummy gate structure 204 and leave a top portion of dummy gate structure 204 uncovered.

Afterwards, contact etch stop layer (CESL) 112 is formed over substrate 102 to cover dummy gate structure 204, as shown in FIG. 2H in accordance with some embodiments. In some embodiments, CESL 112 is made of silicon nitride, silicon oxynitride, and/or other applicable materials. CESL 112 may be formed by plasma enhanced CVD, low pressure CVD, ALD, or other applicable processes.

After CESL 112 is formed, inter-layer dielectric (ILD) layer 114 is formed on CESL 112 over substrate 102 in accordance with some embodiments. In some embodiments, ILD layer 114 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. ILD layer 114 may be formed by chemical vapor deposition (CVD), physical vapor deposition, (PVD), atomic layer deposition (ALD), spin-on coating, or other applicable processes.

Afterwards, a chemical mechanical polishing (CMP) process 211 is performed to ILD layer 114, as shown in FIG. 2I in accordance with some embodiments. ILD layer 114 is planarized by CMP process 211 until the top surface of dummy gate structure 204 is exposed.

After CMP process 211 is performed, dummy gate structure 204, including dummy gate electrode 226 and dummy gate dielectric layer 224, is removed, as shown in FIG. 2J in accordance with some embodiments. In some embodiments, dummy gate structure 204 is removed by dry etching.

After dummy gate structure 204 is removed, a plasma process is performed to form a funnel-shaped trench 234, as shown in FIG. 2K in accordance with some embodiments. Funnel shaped trench 234 includes a cone-shaped top portion 236 and a tube-shaped bottom portion 238. As shown in FIG. 2K, the height of tube-shaped bottom portion 238 of funnel shaped trench 234 is substantially equal to height $H_1$. More specifically, the shape of the bottom portion of dummy gate structure 204 is protected by the remaining portions of sealing layer 108 and spacers 109, and therefore tube-shaped bottom portion 238 of funnel shaped trench 234 is formed. However, the top portion of dummy gate structure 204 is not covered by the remaining portions of sealing layer 108 and spacers 109, and therefore cone-shaped top portion 236 is formed.

As shown in FIG. 2K, there is an angle $\theta_1$ between a sidewall of cone-shaped top portion 236 and a sidewall of tube-shaped bottom portion 238 of funnel shaped trench 234. Angle $\theta_1$ may be controlled by the angle of the plasma used during the plasma process. In some embodiments, angle $\theta_1$ is in a range from about 120° to about 165°. In some embodiments, the plasma process is a high density plasma (HDP) process or an Ar plasma sputtering process.

After funnel shaped trench 234 is formed, metal gate structure 104 is formed in the bottom portion of tube-shaped bottom portion 238 of funnel shaped trench 234, as shown in FIG. 2L in accordance with some embodiments. Metal gate structure 104 includes a gate dielectric layer 103 and a metal gate electrode 105. In some embodiments, gate dielectric layer 103 is made of silicon oxide, silicon oxynitride, or other applicable dielectric materials. Gate dielectric layer 103 may be formed by an ALD process. In some embodiments, metal gate electrode 105 is made of Al, Cu, AiTi, TiN, TiCN, TaN, TaCN, WN, or WCN. Metal gate electrode 105 may be formed by PVD.

In addition, a hard mask material 107 is formed over substrate 102 to cover metal gate structure 104 in accordance with some embodiments. As shown in FIG. 2L, hard mask material 107 fills in the remaining portion of funnel shaped trench 234. Since funnel shaped trench 234 has a large opening at its top portion, it is easier to fill in hard mask material 107 without forming voids. In some embodiments, hard mask material 107 is silicon nitride. Hard mask material 107 may be formed by a CVD process.

Afterwards, a CMP process 221 is performed, as shown in FIG. 2M in accordance with some embodiments. CMP process 221 is performed to expose a top portion of ILD layer 114. In some embodiments, a portion of ILD layer 114 is removed during CMP process 221 to planarize or widen the top surface of ILD layer 114.

As shown in FIG. 2M, after CMP process 221, a funnel shaped hard mask structure 240 is formed. Funnel shaped hard mask structure 240 includes a cone-shaped top portion 242 and a tube-shaped bottom portion 244. The width $W_1$ of a top surface of funnel shaped hard mask structure 240 (e.g. the width of a top surface of cone-shaped top portion 242) is larger than the width $W_2$ of a bottom surface of funnel shaped hard mask structure 240 (e.g. the width of a bottom surface of tube-shaped bottom portion 244). Since the top surface of funnel shaped hard mask structure 240 has a relatively large width, the landing area of the contact formed in subsequent process increases.

In some embodiments, a ratio of width $W_1$ to width $W_2$ is in a range from about 1.1 to about 5. In some embodiments, width $W_1$ is in a range from about 12 nm to about 200 nm. In some embodiments, width $W_2$ is in a range from about 10 nm to about 200 nm. When the ratio of width $W_1$ to width $W_2$ is too small, the contact formed afterwards will be too close to metal gate structure 104. When the ratio of width $W_1$ to width $W_2$ is too large, ILD layer 114 tends to be under etched in the subsequent etching process.

In addition, since funnel shaped hard mask structure 240 has the large top portion, funnel shaped hard mask structure 240 with a relatively large thickness Ti can be formed without voids being formed therein. In some embodiments, thickness Ti is in a range from about 10 nm to about 50 nm. The relatively thick funnel shaped hard mask structure 240 prevents metal gate structure 104 from being too close to the contact formed afterwards.

As shown in FIG. 2M, a sidewall of cone-shaped top portion 242 and a sidewall of tube-shaped bottom portion 244 of funnel shaped hard mask structure 240 also form angle $\theta_1$. In addition, a top surface and the sidewall of cone-shaped top portion 242 of funnel shaped hard mask structure 240 forms an angle $\theta_2$. In some embodiments, angle $\theta_2$ is in a range from about 30° to about 75°. When angle $\theta_2$ is too large, filling hard mask material 107 becomes difficult and voids tend to be formed in the resulting hard mask structure. When angle $\theta_2$ is too small, ILD layer 114 tends to be under etched in the subsequent etching process.

After funnel shaped hard mask structure 240 is formed, dielectric layer 116 is formed over substrate 102 to cover ILD layer 114 and funnel shaped hard mask structure 240, as shown in FIG. 2N in accordance with some embodiments. In some embodiments, dielectric layer 116 is made of silicon oxide, silicon nitride, silicon oxynitride, or other applicable dielectric materials. Dielectric layer 116 may be formed by a CVD process.

Afterwards, a photoresist layer 248 is formed over dielectric layer 116, as shown in FIG. 2O in accordance with some embodiments. Photoresist layer 248 has an opening 250 over a portion of ILD layer 114 and a portion of dielectric layer 116 over funnel shaped hard mask structure 240. Next, an etching process is performed to remove the portions of ILD layer 114 and dielectric layer 116 under opening 250 of photoresist layer 248, as shown in FIG. 2P in accordance with some embodiments. In some embodiments, the etching process is a wet etching process.

More specifically, during the etching process, funnel shaped hard mask structure 240 is used as a mask to protect materials underneath, and therefore a T-shaped trench 260 is formed. As shown in FIG. 2P, a landing area L of funnel shaped hard mask structure 240 is exposed by T-shaped trench 260.

After T-shaped trench 260 is formed, a conductive material is filled in T-shaped trench 160 to form a contact 218, as shown in FIG. 2Q in accordance with some embodiments. In some embodiments, the conductive material is aluminum, copper, tungsten, titanium, tantalum, titanium nitride, tantalum nitride, nickel silicide, cobalt silicide, TaC, TaSiN, TaCN, TiAl, TiAlN, or other applicable conductive materials.

As shown in FIG. 2Q, contact 218 has an extending portion formed over landing area L of funnel shaped hard mask structure 240. Since no voids are formed in funnel shaped hard mask structure 240, the width $W_3$ of the extending portion of contact 218 (i.e. the width of landing area L) can be relatively large. In some embodiments, width $W_3$ is in a range from about 3 nm to about 100 nm. The extending portion of contact 218 prevents the formation of curving sidewalls (e.g. curving sidewalls 122 in FIG. 1).

Next, a CMP process 231 is performed to remove dielectric layer 116 and a top portion of contact 218, as shown in FIG. 2R in accordance with some embodiments. After CMP process 231, the top surface of contact 218 is substantially level with the top surface of funnel shaped hard mask structure 240. Since contact 218 is formed by a self-aligned process using funnel shaped hard mask structure 240 as the mask during the etching process, a sidewall of contact 218 is adjacent to an edge of the top surface of funnel shaped hard mask structure 240. In addition, since the top surface of funnel shaped hard mask structure 240 is relatively large, the distance $D_1$ between metal gate structure 104 and contact 218 is also relatively large. Therefore, risks of metal gate structure 104 being too close to, or even contact to, contact 218 are prevented. In some embodiment, distance $D_1$ is in a range from about 3 nm to about 100 nm.

As described previously, funnel shaped hard mask structure 240 has a relatively large thickness, and therefore shortage between metal gate structure 104 and contact 218 is prevented. In addition, during the formation of funnel shaped hard mask structure 240, hard mask material 107 is deposited in funnel shaped trench 234. Since funnel shaped trench 234 has a relatively large top portion (e.g. cone-shaped top portion 236), formation of voids (e.g. voids 120 in rectangular hard mask structure 106 in FIG. 1) is prevented and contact 218 has a relatively large landing area L over funnel shaped hard mask structure 240.

Furthermore, in the manufacturing process described above, contact 218 is self-aligned to its designed position. More specifically, funnel shaped hard mask structure 240 is used as the mask for forming T-shaped trench 360. Since funnel shaped hard mask structure 240 (e.g. cone-shaped top portion 242 of funnel shaped hard mask structure 240) has a large top surface, alignment of opening 250 of photoresist layer 248 has a relatively large window. Therefore, the formation of self-aligned contact 218 becomes easier.

In addition, funnel shaped hard mask structure 240 do not have curving sidewalls (e.g. curving sidewalls 122 illustrated in FIG. 1). As a result, risks of shortages resulting from contact 218 being too close to metal gate structure 104 decrease.

Embodiments for a semiconductor device structure are provided. The semiconductor device structure includes a funnel shaped hard mask structure or a metal gate structure. The funnel shaped hard mask structure has a cone-shaped top portion and a tube-shaped bottom portion. Formation of voids, which tend to be formed in a rectangular hard mask structure, is prevented. In addition, formation of a self-aligned contact in the semiconductor device becomes easier, and risks of shortage between the contact and a metal gate structure in the semiconductor device decrease.

In some embodiments, a method for forming a semiconductor device structure is provided. The method for forming a semiconductor device structure includes forming a dummy gate structure over a substrate and forming a spacer on a lower portion of a sidewall of the dummy gate structure and exposing an upper portion of the sidewall of the dummy gate structure. The method for forming a semiconductor device structure further includes forming a dielectric layer covering the upper portion of the sidewall of the dummy gate structure exposed by the spacer and removing the dummy gate structure to form a tube-shaped trench. The method for forming a semiconductor device structure further includes removing a portion of the dielectric layer to form a cone-shaped trench over the tube-shaped trench and forming a gate structure in a bottom portion of the tube-shaped trench. The method for forming a semiconductor device structure further includes forming a hard mask structure in the cone-shaped trench and an upper portion of the tube-shaped trench. In addition, an interface between the hard mask structure and the dielectric layer overlaps the spacer.

In some embodiments, a method for forming a semiconductor device structure is provided. The method for forming a semiconductor device structure includes forming a dummy gate structure over a substrate and forming a spacer on a sidewall of the dummy gate structure. The method for forming a semiconductor device structure further includes forming a resist layer covering a lower portion of the spacer and exposing an upper portion of the spacer and removing the upper portion of the spacer exposed by the resist layer, thereby only a lower sidewall of the dummy gate structure is covered by the spacer. The method for forming a semiconductor device structure further includes removing the resist layer and forming a dielectric layer on an upper sidewall of the dummy gate structure. The method for forming a semiconductor device structure further includes removing the dummy gate structure to form a trench and removing a portion of the dielectric layer to form a slope sidewall. The method for forming a semiconductor device structure further includes forming a gate structure in a bottom portion of the trench and forming a hard mask structure over the gate structure. In addition, the hard mask structure covers the slope sidewall of the dielectric layer.

In some embodiments, a method for forming a semiconductor device structure is provided. The method for forming a semiconductor device structure includes forming a dummy gate structure over a substrate and forming a sealing layer on a lower portion of asidewall of the dummy gate structure. The method for forming a semiconductor device structure further includes forming a dielectric layer on an upper portion of the sidewall of the dummy gate structure and removing the dummy gate structure to form a trench having a substantially straight sidewall formed of a sidewall of the sealing layer and a sidewall of the dielectric layer. The method for forming a semiconductor device structure further includes etching the dielectric layer to form a slope sidewall, thereby forming a funnel shaped trench by the slope sidewall of the dielectric layer and the sidewall of the sealing layer and forming a gate structure in the funnel shaped trench. The method for forming a semiconductor device structure further includes forming a hard mask structure in the funnel shaped trench. In addition, the hard mask structure is in direct contact with the sidewall of the sealing layer and the slope sidewall of the dielectric layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a semiconductor structure, comprising:
    forming a dummy gate structure over a substrate;
    forming a spacer on a lower portion of a sidewall of the dummy gate structure and exposing an upper portion of the sidewall of the dummy gate structure;
    forming a source/drain region in the substrate;
    forming a dielectric layer covering the upper portion of the sidewall of the dummy gate structure exposed by the spacer;
    removing the dummy gate structure to form a tube-shaped trench;
    removing a portion of the dielectric layer to form a cone-shaped trench over the tube-shaped trench;
    forming a gate structure in a bottom portion of the tube-shaped trench;
    forming a hard mask structure in the cone-shaped trench and an upper portion of the tube-shaped trench;
    forming a contact over the source/drain structure, wherein the contact has an extending portion covering a top surface of the hard mask structure; and
    polishing the contact to remove the extending portion of the contact,
    wherein an interface between the hard mask structure and the dielectric layer overlaps the spacer and the source/drain region.

2. The method for forming a semiconductor structure as claimed in claim 1, wherein the extending portion of the contact overlaps the dielectric layer.

3. The method for forming a semiconductor structure as claimed in claim 1, wherein the extending portion of the contact has a lateral width in a range from about 3 nm to about 100 nm.

4. The method for forming a semiconductor structure as claimed in claim 1, wherein the hard mask structure has a slope sidewall overlapping an outmost sidewall of the spacer.

5. The method for forming a semiconductor structure as claimed in claim 1, wherein an interface between the gate structure and the hard mask structure is lower than a topmost point of the spacer.

6. The method for forming a semiconductor structure as claimed in claim 1, wherein an interface between the gate structure and the hard mask structure is lower than a top surface of the contact.

7. The method for forming a semiconductor structure as claimed in claim 1, wherein a first width of a top surface of the hard mask structure is greater than a second width of a bottom surface of the hard mask structure, and the second width of the bottom surface of hard mask structure is substantially equal to a width of the gate structure.

8. A method for forming a semiconductor structure, comprising:
    forming a dummy gate structure over a substrate;
    forming a spacer on a sidewall of the dummy gate structure;
    forming a resist layer covering a lower portion of the spacer and exposing an upper portion of the spacer;
    removing the upper portion of the spacer exposed by the resist layer, thereby only a lower sidewall of the dummy gate structure is covered by the spacer;
    removing the resist layer;
    forming a dielectric layer on an upper sidewall of the dummy gate structure;
    removing the dummy gate structure to form a trench;
    removing a portion of the dielectric layer to form a slope sidewall;
    forming a gate structure in a bottom portion of the trench; and
    forming a hard mask structure over the gate structure, wherein the hard mask structure covers the slope sidewall of the dielectric layer.

9. The method for forming a semiconductor structure as claimed in claim 8, wherein the spacer completely overlaps with the hard mask structure.

10. The method for forming a semiconductor structure as claimed in claim 8, wherein the hard mask structure is in direct contact with the slope sidewall of the dielectric layer.

11. The method for forming a semiconductor structure as claimed in claim 8, wherein an angle between the slope sidewall of the dielectric layer and a sidewall of the trench is in a range from about 120 to about 165.

12. The method for forming a semiconductor structure as claimed in claim 8, further comprising:
    forming an interlayer dielectric layer over the dielectric layer before removing the dummy gate structure to form the trench; and
    removing a portion of the interlayer dielectric layer to form a cone-shape trench surrounded by the interlayer dielectric layer and the dielectric layer.

13. The method for forming a semiconductor structure as claimed in claim 12, further comprising:
    forming a contact through the interlayer dielectric layer, wherein an extending portion of the contact overlaps the hard mask structure, the interlayer dielectric layer, and the dielectric layer.

14. The method for forming a semiconductor structure as claimed in claim 13, further comprising:
    removing the extending portion of the contact.

15. A method for forming a semiconductor structure, comprising:
    forming a dummy gate structure over a substrate;
    forming a sealing layer on a lower portion of a sidewall of the dummy gate structure;
    forming a dielectric layer on an upper portion of the sidewall of the dummy gate structure;
    removing the dummy gate structure to form a trench having a substantially straight sidewall formed of a sidewall of the sealing layer and a sidewall of the dielectric layer;
    etching the dielectric layer to form a slope sidewall, thereby forming a funnel shaped trench by the slope sidewall of the dielectric layer and the sidewall of the sealing layer;
    forming a gate structure in the funnel shaped trench; and
    forming a hard mask structure in the funnel shaped trench, wherein the hard mask structure is in direct contact with the sidewall of the sealing layer and the slope sidewall of the dielectric layer.

16. The method for forming a semiconductor structure as claimed in claim 15, further comprising:
  forming a spacer over the sealing layer, wherein a top of the spacer is substantially level with a top of the sealing layer.

17. The method for forming a semiconductor structure as claimed in claim 16, wherein the hard mask structure overlaps an outmost sidewall of the spacer.

18. The method for forming a semiconductor structure as claimed in claim 17, further comprising:
  forming a source/drain structure in the substrate, wherein the hard mask structure overlaps the source/drain structure.

19. The method for forming a semiconductor structure as claimed in claim 15, wherein the hard mask structure has a cone-shaped top portion and a tube-shaped bottom portion.

20. The method for forming a semiconductor structure as claimed in claim 19, wherein a lateral distance between an outer edge of the tube shaped bottom portion of the hard mask structure and an outer edge of the cone-shaped top portion of the hard mask structure is in a range from about 3 nm to about 100 nm.

* * * * *